(12) United States Patent
Morales

(10) Patent No.: US 9,918,412 B2
(45) Date of Patent: Mar. 13, 2018

(54) COOLING AIR STACK FOR COMPUTER EQUIPMENT

(71) Applicant: Amazon Technologies, Inc., Seattle, WA (US)

(72) Inventor: Osvaldo P. Morales, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 15/243,538

(22) Filed: Aug. 22, 2016

(65) Prior Publication Data

US 2016/0360651 A1    Dec. 8, 2016

Related U.S. Application Data

(62) Division of application No. 12/163,146, filed on Jun. 27, 2008, now Pat. No. 9,426,903.

(51) Int. Cl.
*H05K 7/20* (2006.01)
*H05K 5/00* (2006.01)

(52) U.S. Cl.
CPC .......... *H05K 7/20836* (2013.01); *H05K 5/00* (2013.01); *H05K 7/20145* (2013.01); *H05K 7/20736* (2013.01); *H05K 7/20745* (2013.01); *F24F 2221/40* (2013.01)

(58) Field of Classification Search
None
See application file for complete search history.

(56) References Cited

U.S. PATENT DOCUMENTS

| | | | | |
|---|---|---|---|---|
| 1,031,456 A * | 7/1912 | Leslie | ...................... | E06B 7/26 454/220 |
| 1,586,706 A * | 6/1926 | Russell | .................... | F16L 25/14 15/301 |
| 3,467,411 A * | 9/1969 | Doxzon | .................. | F16L 41/10 228/143 |
| 3,481,485 A | 12/1969 | Hess | | |
| 3,807,572 A | 4/1974 | Luvara et al. | | |
| 3,834,423 A | 9/1974 | Elson | | |

(Continued)

FOREIGN PATENT DOCUMENTS

| | | |
|---|---|---|
| EP | 0 546 211 | 6/1993 |
| EP | 0 741 269 | 11/1996 |

(Continued)

OTHER PUBLICATIONS

U.S. Appl. No. 11/535,180, filed Sep. 26, 2016, Osvaldo Patricio Morales.

(Continued)

*Primary Examiner* — Alissa Tompkins
*Assistant Examiner* — Martha Becton
(74) *Attorney, Agent, or Firm* — Robert C. Kowert; Meyertons, Hood, Kivlin, Kowert & Goetzel, P.C.

(57) ABSTRACT

A cooling system for a computer room includes a forced air system. The forced air system moves cooling air through computers in one or more rack systems in the computer room. Stacks are coupled between the rack systems and the ceiling of the computer room. Each stack may include a flexible portion between an inlet portion and an exit portion of the stack. The stacks direct cooling air exiting from exit ports on the rack systems to openings in the ceiling.

20 Claims, 4 Drawing Sheets

(56) References Cited

U.S. PATENT DOCUMENTS

| | | | |
|---|---|---|---|
| 3,915,477 A | | 10/1975 | Timmons |
| 4,081,915 A | * | 4/1978 | Materniak nee Babcerowicz .......... D06F 58/20 285/9.1 |
| 4,082,092 A | | 4/1978 | Foster |
| 4,328,897 A | | 5/1982 | Weiss |
| 4,448,111 A | | 5/1984 | Doherty |
| 4,585,122 A | | 4/1986 | Stegenga |
| 4,864,469 A | | 9/1989 | Boudon |
| 4,926,291 A | | 5/1990 | Sarraf |
| 5,080,403 A | * | 1/1992 | Paoluccio ................ F16L 41/00 285/189 |
| 5,208,722 A | | 5/1993 | Ryan et al. |
| 5,240,288 A | * | 8/1993 | Inda ..................... F16L 41/025 138/109 |
| 5,294,049 A | | 3/1994 | Trunkle et al. |
| 5,412,534 A | | 5/1995 | Cutts et al. |
| 5,456,498 A | | 10/1995 | Greene |
| 5,473,507 A | | 12/1995 | Schwegler et al. |
| 5,506,750 A | | 4/1996 | Carteau et al. |
| 5,518,277 A | | 5/1996 | Sanders |
| 5,621,890 A | | 4/1997 | Notarianni et al. |
| 5,644,472 A | | 7/1997 | Klein |
| 5,682,289 A | | 10/1997 | Schwegler et al. |
| 5,751,549 A | | 5/1998 | Eberhardt et al. |
| 5,772,500 A | | 6/1998 | Harvey et al. |
| 5,796,580 A | | 8/1998 | Komatsu et al. |
| 5,806,438 A | | 9/1998 | Beaudet |
| 5,822,184 A | | 10/1998 | Rabinovitz |
| 5,843,131 A | | 12/1998 | McDonough |
| 5,871,396 A | | 2/1999 | Shen |
| 5,948,509 A | | 9/1999 | Felson |
| 5,957,506 A | * | 9/1999 | Stepp ..................... F16L 43/00 285/183 |
| 6,031,717 A | | 2/2000 | Baddour et al. |
| 6,039,190 A | | 3/2000 | Clausen |
| 6,125,924 A | * | 10/2000 | Lin ........................ G06F 1/20 165/122 |
| 6,141,986 A | | 11/2000 | Koplin |
| 6,166,917 A | | 12/2000 | Anderson |
| 6,230,418 B1 | * | 5/2001 | Gomulinski ............ D06F 58/04 285/181 |
| 6,259,605 B1 | | 7/2001 | Schmitt |
| 6,364,009 B1 | | 4/2002 | Macmanus et al. |
| 6,425,417 B1 | | 7/2002 | Paschke |
| 6,459,579 B1 | | 10/2002 | Farmer et al. |
| 6,469,899 B2 | | 10/2002 | Hastings et al. |
| 6,496,366 B1 | | 12/2002 | Coglitore et al. |
| 6,499,609 B2 | | 12/2002 | Patriche et al. |
| 6,525,936 B2 | | 2/2003 | Beitelmal et al. |
| 6,563,704 B2 | | 5/2003 | Grouell et al. |
| 6,574,970 B2 | | 6/2003 | Spinazzola et al. |
| 6,590,768 B1 | | 7/2003 | Wiley |
| 6,603,661 B2 | | 8/2003 | Smith et al. |
| 6,616,524 B2 | | 9/2003 | Storck, Jr. et al. |
| 6,621,693 B1 | | 9/2003 | Potter et al. |
| 6,625,020 B1 | | 9/2003 | Hanson et al. |
| 6,650,535 B1 | | 11/2003 | Moss et al. |
| 6,772,604 B2 | | 1/2004 | Eveley |
| 6,754,082 B1 | | 6/2004 | Ding et al. |
| 6,767,280 B1 | | 7/2004 | Berger |
| 6,791,836 B2 | | 9/2004 | Cipolla et al. |
| 6,795,314 B1 | | 9/2004 | Arbogast et al. |
| 6,804,123 B1 | | 10/2004 | Cheng |
| 6,819,567 B2 | | 11/2004 | Baker et al. |
| 6,833,995 B1 | | 12/2004 | Hsue et al. |
| 6,859,366 B2 | | 2/2005 | Fink et al. |
| 6,881,142 B1 | | 4/2005 | Nair |
| 6,940,716 B1 | * | 9/2005 | Korinsky ................ G06F 1/20 165/121 |
| 6,960,130 B2 | | 11/2005 | Gebke et al. |
| 7,003,966 B2 | | 2/2006 | Sharma et al. |
| 7,010,392 B2 | | 3/2006 | Bash et al. |
| 7,031,154 B2 | | 4/2006 | Bash et al. |
| 7,035,111 B1 | | 4/2006 | Lin et al. |
| 7,042,722 B2 | | 5/2006 | Suzuki et al. |
| 7,068,505 B2 | | 6/2006 | Kosugi |
| D527,091 S | * | 8/2006 | Stout, Jr. ...................... D23/393 |
| 7,112,131 B2 | | 9/2006 | Rasmussen et al. |
| 7,197,433 B2 | | 3/2007 | Patel et al. |
| 7,238,104 B1 | | 7/2007 | Greenslade et al. |
| 7,257,956 B2 | | 8/2007 | Shimada et al. |
| 7,259,963 B2 | | 8/2007 | Germagian et al. |
| 7,272,001 B2 | | 9/2007 | Cheng |
| 7,278,273 B1 | | 10/2007 | Whitted et al. |
| 7,283,358 B2 | | 10/2007 | Campbell et al. |
| 7,315,448 B1 | * | 1/2008 | Bash .................... H05K 7/2079 165/80.3 |
| 7,346,913 B2 | | 3/2008 | Ishimine et al. |
| 7,361,081 B2 | | 4/2008 | Beitelmal et al. |
| 7,379,299 B2 | | 5/2008 | Walsh et al. |
| 7,393,021 B1 | * | 7/2008 | Lukjan ................ F24F 13/0209 285/183 |
| 7,403,385 B2 | | 7/2008 | Boone et al. |
| 7,408,775 B2 | | 8/2008 | Waltz et al. |
| 7,434,413 B2 | | 10/2008 | Wruck |
| 7,486,505 B2 | | 2/2009 | Fushimi et al. |
| 7,499,286 B2 | | 3/2009 | Berke et al. |
| 7,500,911 B2 | | 3/2009 | Johnson et al. |
| 7,542,288 B2 | | 6/2009 | Lanus |
| 7,660,117 B2 | | 2/2010 | Werner et al. |
| 7,660,166 B2 | | 2/2010 | Claassen et al. |
| 7,701,710 B2 | | 4/2010 | Tanaka et al. |
| 7,716,939 B1 | * | 5/2010 | Morales ............. H05K 7/20836 361/688 |
| 7,724,515 B2 | | 5/2010 | Fukuda et al. |
| 7,733,666 B2 | | 6/2010 | Ichihara et al. |
| 7,746,634 B2 | | 6/2010 | Horn et al. |
| 7,753,766 B2 | | 7/2010 | Master et al. |
| 7,764,498 B2 | | 7/2010 | Conn |
| 7,768,780 B2 | | 8/2010 | Coglitore et al. |
| 7,768,787 B2 | | 8/2010 | Vaughan et al. |
| 7,804,685 B2 | | 9/2010 | Krietzman |
| 7,813,129 B2 | * | 10/2010 | Van Der Werff .. H05K 7/20727 361/679.48 |
| 7,821,790 B2 | | 10/2010 | Sharma et al. |
| 7,843,685 B2 | | 11/2010 | Beauchamp et al. |
| 7,854,652 B2 | | 12/2010 | Yates et al. |
| 7,869,210 B2 | | 1/2011 | Moss |
| 7,878,888 B2 | | 2/2011 | Rasmussen et al. |
| 7,903,407 B2 | | 3/2011 | Matsushima et al. |
| 7,929,300 B1 | | 4/2011 | Bisbikis et al. |
| 7,944,700 B2 | | 5/2011 | Wang et al. |
| 7,990,700 B2 | | 8/2011 | Guo |
| 8,087,979 B2 | | 1/2012 | Rasmussen |
| 8,154,870 B1 | | 4/2012 | Czamara et al. |
| 8,180,495 B1 | | 5/2012 | Roy |
| 8,348,731 B2 | | 1/2013 | Johnson et al. |
| 8,469,782 B1 | | 6/2013 | Roy |
| 8,672,733 B2 | | 3/2014 | Chen et al. |
| 8,721,409 B1 | | 5/2014 | Morales |
| 9,426,903 B1 | * | 8/2016 | Morales .................... H05K 5/00 |
| 2001/0029163 A1 | | 10/2001 | Spinazzola et al. |
| 2002/0007643 A1 | * | 1/2002 | Spinazzola ............... G06F 1/20 62/259.2 |
| 2002/0021557 A1 | | 2/2002 | Ishimine et al. |
| 2002/0100736 A1 | | 8/2002 | Lopez |
| 2002/0108386 A1 | * | 8/2002 | Spinazzola ........ H05K 7/20745 62/259.2 |
| 2002/0134531 A1 | | 9/2002 | Yanagida |
| 2002/0181194 A1 | | 12/2002 | Ho et al. |
| 2003/0156385 A1 | | 8/2003 | Askeland et al. |
| 2003/0177724 A1 | * | 9/2003 | Botting .................... F24F 13/20 52/302.1 |
| 2004/0020224 A1 | | 2/2004 | Bash et al. |
| 2004/0032722 A1 | | 2/2004 | Wrycraft et al. |
| 2004/0045308 A1 | * | 3/2004 | Field ...................... F24F 1/022 62/237 |
| 2004/0099747 A1 | * | 5/2004 | Johnson ............. H05K 7/20836 236/49.3 |
| 2004/0165349 A1 | | 8/2004 | Arbogast et al. |
| 2004/0218355 A1 | | 11/2004 | Bash et al. |

(56) References Cited

U.S. PATENT DOCUMENTS

| | | |
|---|---|---|
| 2005/0048896 A1* | 3/2005 | Shaben ............... F24F 11/0086 454/49 |
| 2005/0122679 A1* | 6/2005 | Von Gutfeld ............ G06F 1/20 361/679.49 |
| 2005/0135069 A1 | 6/2005 | King et al. |
| 2005/0166860 A1 | 8/2005 | Austin et al. |
| 2005/0188689 A1 | 9/2005 | Juby et al. |
| 2005/0228618 A1 | 10/2005 | Patel et al. |
| 2005/0237716 A1 | 10/2005 | Chu et al. |
| 2005/0257232 A1 | 11/2005 | Hidaka |
| 2005/0265004 A1 | 12/2005 | Coglitore et al. |
| 2005/0281014 A1 | 12/2005 | Carullo et al. |
| 2006/0059937 A1 | 3/2006 | Perkins et al. |
| 2006/0061955 A1 | 3/2006 | Imblum |
| 2006/0274496 A1 | 12/2006 | Lee et al. |
| 2006/0290245 A1 | 12/2006 | Hidaka |
| 2007/0053169 A1 | 3/2007 | Carlson et al. |
| 2007/0058336 A1 | 3/2007 | Cheng |
| 2007/0074525 A1 | 4/2007 | Vinson et al. |
| 2007/0076369 A1 | 4/2007 | Chen et al. |
| 2007/0101746 A1 | 5/2007 | Scholm et al. |
| 2007/0159790 A1 | 7/2007 | Coglitore et al. |
| 2007/0171613 A1* | 7/2007 | McMahan ............ H05K 7/20736 361/695 |
| 2007/0213000 A1 | 9/2007 | Day |
| 2007/0217172 A1 | 9/2007 | Bisbikis et al. |
| 2007/0223200 A1 | 9/2007 | Fujiya |
| 2007/0240433 A1 | 10/2007 | Manole |
| 2007/0254583 A1* | 11/2007 | Germagian ......... H05K 7/20745 454/184 |
| 2008/0013275 A1 | 1/2008 | Beckley et al. |
| 2008/0029250 A1 | 2/2008 | Carlson et al. |
| 2008/0037209 A1 | 2/2008 | Niazi et al. |
| 2008/0043427 A1 | 2/2008 | Lee et al. |
| 2008/0055846 A1 | 3/2008 | Clidaras et al. |
| 2008/0094797 A1 | 4/2008 | Coglitore et al. |
| 2008/0112127 A1 | 5/2008 | June et al. |
| 2008/0158813 A1 | 7/2008 | Yin |
| 2008/0191590 A1 | 8/2008 | Lin et al. |
| 2008/0232064 A1 | 9/2008 | Sato et al. |
| 2008/0259566 A1 | 10/2008 | Fried |
| 2008/0285232 A1 | 11/2008 | Claassen et al. |
| 2008/0305733 A1 | 12/2008 | Noteboom et al. |
| 2008/0318514 A1* | 12/2008 | Fettkether ............ F24F 13/0218 454/330 |
| 2009/0061755 A1 | 3/2009 | Calder et al. |
| 2009/0081936 A1* | 3/2009 | Luu ..................... B08B 15/002 454/49 |
| 2009/0086441 A1 | 4/2009 | Randall et al. |
| 2009/0097200 A1 | 4/2009 | Sharma et al. |
| 2009/0109609 A1 | 4/2009 | Lai et al. |
| 2009/0122505 A1 | 5/2009 | Lu |
| 2009/0237877 A1 | 9/2009 | Honda et al. |
| 2009/0239460 A1* | 9/2009 | Lucia ................ H05K 7/20745 454/184 |
| 2009/0257187 A1 | 10/2009 | Mills et al. |
| 2009/0260384 A1 | 10/2009 | Champion et al. |
| 2009/0296322 A1 | 12/2009 | Yang et al. |
| 2009/0301123 A1 | 12/2009 | Monk et al. |
| 2009/0321105 A1 | 12/2009 | Sawyer |
| 2010/0024445 A1 | 2/2010 | Cichanowicz |
| 2010/0091458 A1 | 4/2010 | Mosier et al. |
| 2010/0149754 A1 | 6/2010 | Chapel et al. |
| 2010/0271766 A1 | 10/2010 | Lin |
| 2011/0111838 A1* | 5/2011 | Bauer ..................... G06F 1/20 463/25 |
| 2011/0149508 A1 | 6/2011 | Malekmadani |
| 2011/0284422 A1 | 11/2011 | Yamada |
| 2012/0092811 A1 | 4/2012 | Chapel et al. |

FOREIGN PATENT DOCUMENTS

| | | |
|---|---|---|
| EP | 2 053 911 | 4/2009 |
| EP | 2202751 | 6/2010 |
| JP | 2010086450 | 4/2010 |
| WO | 98/34450 | 8/1998 |
| WO | 9834450 | 8/1998 |
| WO | 2008/143503 | 11/2008 |
| WO | 2008143503 | 11/2008 |

OTHER PUBLICATIONS

U.S. Appl. No. 12/341,137, filed Dec. 28, 2008, Jonathan David Hay.
U.S. Appl. No. 11/956,849, filed Dec. 14, 2007, Osvaldo P. Morales.
U.S. Appl. No. 12/163,146, filed Jun. 27, 2008, Osvaldo P. Morales.
U.S. Appl. No. 12/751,2016, filed Mar. 31, 2010, Michael W. Schrempp.
U.S. Appl. No. 12/886,469, filed Sep. 20, 2010, Peter G. Ross.
U.S. Appl. No. 12/751,209, filed Mar. 31, 2010, Michael P. Czamara.
U.S. Appl. No. 12/646,417, filed Dec. 23, 2009, Michael P. Czamara.
U.S. Appl. No. 12/751,212, filed Mar. 31, 2010, Michael P. Czamara.
U.S. Appl. No. 12/886,440, filed Sep. 20, 2010, Peter G. Ross, et al.
U.S. Appl. No. 12/886,472, filed Sep. 20, 2010, Peter G. Ross.
U.S. Appl. No. 12/893,813, filed Sep. 29, 2010, Richard C. Towner.
U.S. Appl. No. 13/103,860, filed May 9, 2011, Michael P. Czamara.
U.S. Appl. No. 12/886,437, filed Sep. 20, 2010, Peter G. Ross.

* cited by examiner

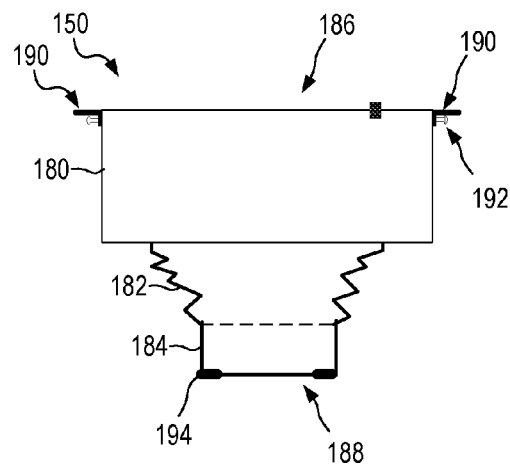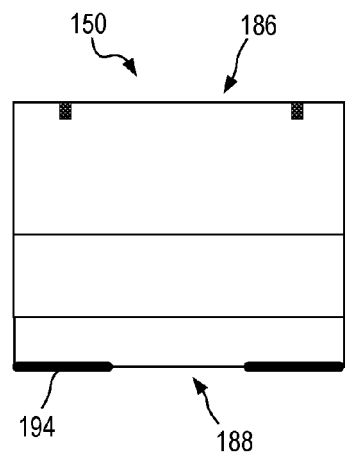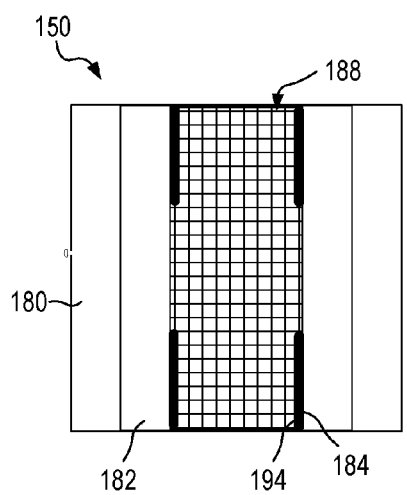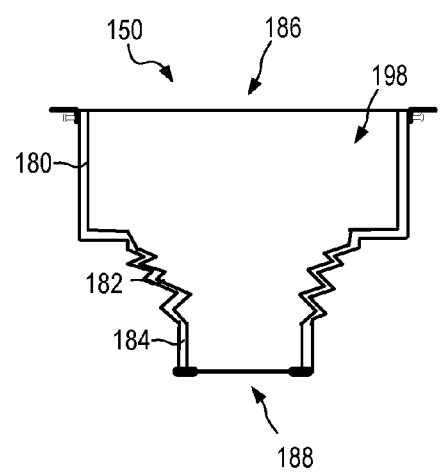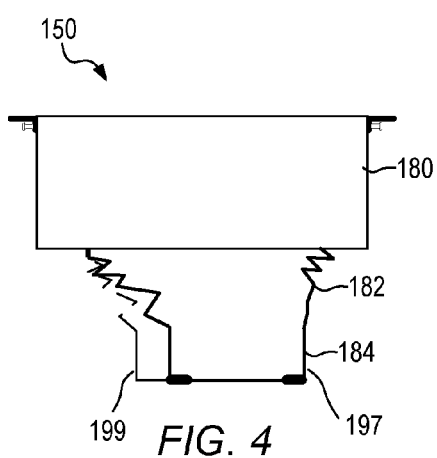

COOLING AIR STACK FOR COMPUTER EQUIPMENT

This application is a divisional of U.S. patent application Ser. No. 12/163,146, filed Jun. 27, 2008, now U.S. Pat. No. 9,426,903, which is hereby incorporated by reference herein in its entirety.

BACKGROUND

Field of the Invention

The present invention relates generally to cooling systems and more particularly, to methods and apparatus for cooling electronic components.

Description of the Related Art

Some known electronic components generate waste heat energy when energized. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems.

Some known data centers include methods and apparatus configured to facilitate waste heat removal from a plurality of racking systems. Moreover, some known data centers include a plurality of racking systems that have a plurality of configurations that are non-uniform with respect to component density and usage such that each racking system generates waste heat at a non-uniform rate as compared to the remainder of the racking systems. In such data centers, application of uniform heat removal methods and apparatus to such non-uniform waste heat generation sources may not be fully efficient and effective in waste heat removal.

In many computer rooms, cooling air carrying waste heat from the racking systems is vented to the room ambient air above the racking systems. At the same time, an air handling system for the room draws air out of the room through vents in the ceiling or walls of the room, thereby maintaining a steady-state flow of air in the room. Before the exit air carrying the waste racking system reaches the vents, the exit air from the racking systems mixes with the room ambient air. Some of the waste heat from the exit air is transferred into the room ambient air, which causes the ambient temperature in the room to rise and may create short-cycling and other inefficiencies in cooling of the racking systems.

SUMMARY

Various embodiments of apparatus and methods of cooling computers in a data center are disclosed. In an embodiment, a stack for directing cooling air from a rack-mounted computer system includes an inlet portion, an exit portion, and a flexible portion between the inlet portion and the exit portion. The inlet portion of the stack couples with a rack system at an exit port of the rack system. The exit portion of the stack couples with a ceiling of a data room at an opening in the ceiling.

In an embodiment, a cooling system for a computer room includes a forced air system. The forced air system moves cooling air through computers in one or more rack systems in the computer room. Stacks are coupled between the rack systems and the ceiling of the computer room. The stacks direct cooling air exiting from exit ports on the rack systems to openings in the ceiling.

In an embodiment, a method of cooling rack-mounted computers in a computer room includes moving cooling air through computers in a rack system. The cooling air is directed away from the rack system to an opening in a ceiling of the computer room such that the exiting cooling air is segregated from room ambient air in the computer room.

BRIEF DESCRIPTION OF THE DRAWINGS

FIGS. 2A, 2B, and 2C illustrate one embodiment of a stack having flexible portions on opposing sides of the stack.

FIG. 3 illustrates a cross-sectional area of the stack illustrated in FIGS. 2A, 2B, and 2C.

FIG. 4 illustrates adjustment of a stack having flexible portions.

Figure 1:
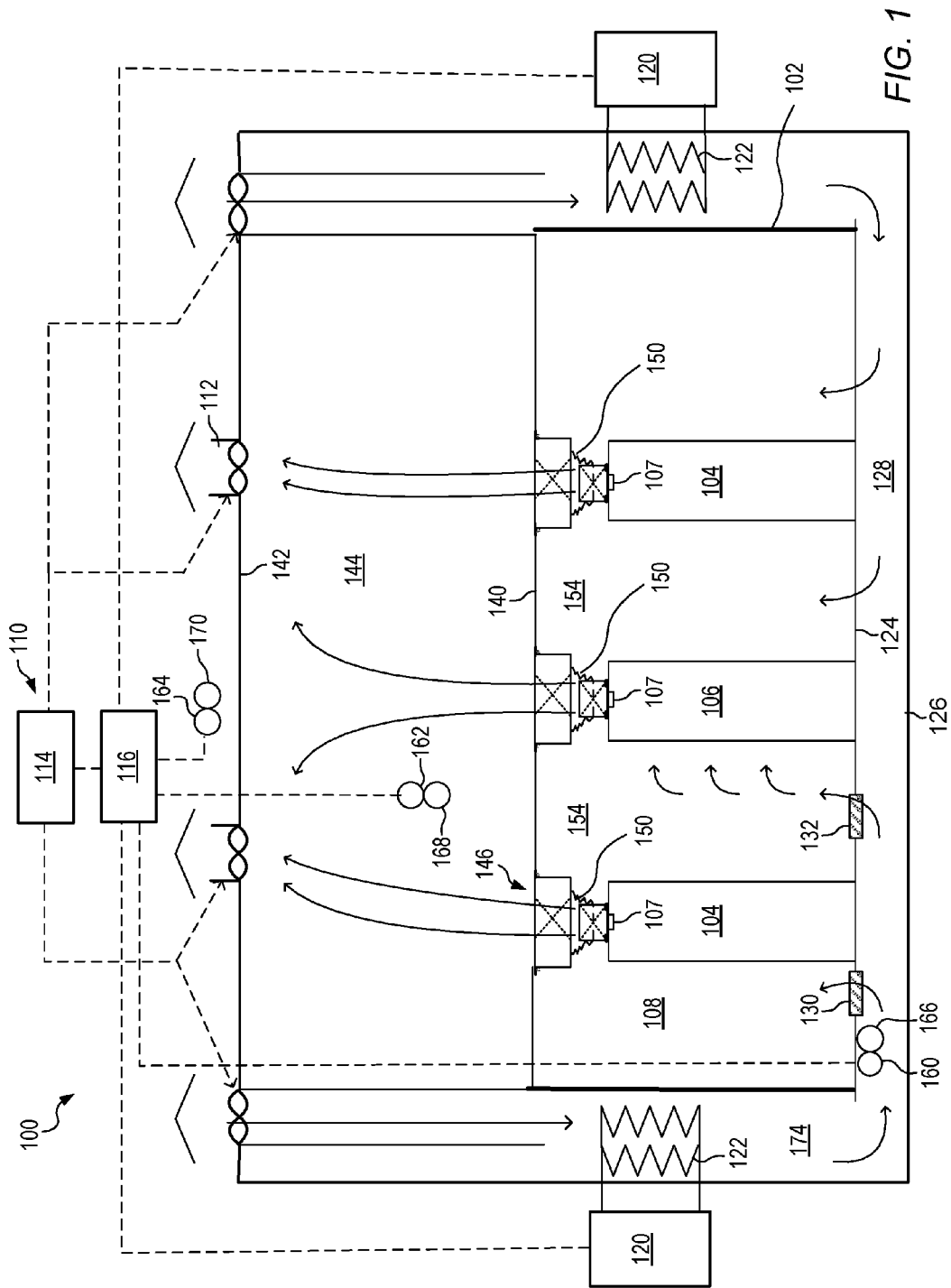
FIG. 1 is a schematic view of an exemplary data center cooling system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "stack" includes any element or combination of elements that has at least one passageway for transporting, directing, channeling or venting gas (e.g., cooling air) from a system or component in upward direction (at least partially upward). A stack may be in the form of a conduit, tube, duct, plenum, channel, shell, or a combination of one or more such elements. Structural elements of a stack may be flexible, rigid, or a combination thereof. A stack may be tall or short relative to its lateral dimensions (e.g., width, depth, circumference). The cross sectional area of a passageway of a stack may be rectangular, square, circular, or any of various other regular or irregular shapes. The cross sectional area of a passageway of a stack may be uniform over the height of the stack or may vary over the height of the stack. For example, a passageway of a stack may be tapered such that the passageway has greater cross sectional area at the top than at the bottom. In certain embodiments, a stack may be partially open in its installed condition (e.g., have an open cross section, pores, holes, slots, vents, or other openings).

As used herein, to "direct" a fluid includes to at least partially direct, channel, route, contain, or transport the fluid (e.g., cooling air).

As used herein, "port" includes an opening or openings that allow a fluid (e.g., cooling air) to enter or exit a component or system.

As used herein, "ceiling" includes an overhead interior surface of a room. A ceiling may be in the form of tiles, sheets, panels, wallboard, or other suitable material. A ceiling may be attached to, supported by, and/or suspended from joists, adjacent walls, rods, beams, a roof, columns, or other structural member(s).

FIG. 1 is a schematic view of an exemplary data center cooling system 100. System 100 is configured to remove waste heat generation from a data center 102. Data center 102 includes at least one high-density equipment rack system, or high-density rack 104, and at least one low-density equipment rack system, or low-density rack 106. Racks 104 and 106 are substantially similar with the exception of a configuration of electronic components (not shown) within each of racks 104 and 106 and the associated waste heat generation. Racks 104 and 106 include exit ports 107. Exit ports 107 may be used to remove heated cooling air from racks 104 and 106. Typically, waste heat generation from high-density rack 104 is greater than waste heat generation from low-density rack 106 due to the greater concentration of waste heat sources within rack 104 as compared to rack 106. Racks 104 and 106 are positioned within room 108 of data center 102.

Cooling system 100 includes air handling sub-system 110. Air handling sub-system 110 is coupled in flow communication with room 108. In one embodiment, air handling sub-system 110 is configured to channel approximately 1,332 cubic meters of air per minute ($m^3$/min) (approximately 47,000 cubic feet per minute ($ft^3$/min).

Air handling sub-system 110 includes fans 112. Fans 112 are coupled to VFDs 114. VFDs 114 are coupled to control unit 116. VFDs 114 may use pulse width modulation (PWM) methods as are know in the art to modulate the rotational velocity of the associated prime movers. Alternatively, any method of modulation that facilitates operation of system 100 as described herein is used.

Cooling system 100 includes chilled water subsystems 120. Chilled water subsystems 120 may be coupled in heat transfer communication with air handling sub-systems 110. Chilled water sub-system 120 includes coils 122. Chilled water sub-system 120 may be controlled by control unit 116.

In some embodiments, chilled water subsystems 120 may be coupled to a chilled water heat removal system. Examples of chilled water heat removal systems include a service water subsystem, air-conditions refrigerant sub-system, or a cooling tower sub-system.

In an embodiment, control unit 116 is configured with at least one algorithm to receive measurement signals and modulate VFDs, as well as control elements in chilled water sub-system 120, to maintain a predetermined differential temperature across racks 104 and 106.

Data center 102 includes raised floor 124 that at least partially forms room 108. Data center 102 also includes lower floor 126 that cooperates with floor 124 to at least partially form data center air supply plenum 128. Floor 124 is configured to support data center components that are positioned within room 108 that include, but are not limited to, racks 104 and 106. At least one high-density air flow restriction device 130 is positioned within floor 124 and is configured such that a first predetermined rate of air flow at a first predetermined velocity is facilitated to impinge on each of racks 104. Similarly, at least one low-density air flow restriction device 132 is positioned within floor 124 and is configured such that a second predetermined rate of air flow at a second predetermined velocity is facilitated to impinge on each of racks 106. Devices 130 and 132 facilitate coupling plenum 128 in flow communication with room 108.

In one embodiment, devices 130 and 132 are gratings fabricated to facilitate attaining the associated predetermined air flows and velocities. Alternatively, devices 130 and 132 are any devices that facilitate operation of cooling system 100 as described herein, including, but not limited to, perforated floor tiles wherein such perforations are dimensioned and positioned to attain the associated predetermined air flows and velocities. Also, in one embodiment, racks 104 and 106 are configured to facilitate channeling heat-removing airflow into and throughout racks 104 and 106 from devices 130 and 132, respectively. Airflow is channeled such that substantially all of the waste heat generated by racks 104 and 106 is channeled out of racks 104 and 106 through exit ports 107 in the associated tops of racks 104 and 106.

Data center 102 includes drop ceiling 140 that at least partially forms room 108. Data center 102 further includes upper ceiling 142 that cooperates with drop ceiling 150 to at least partially form a data center overhead air discharge plenum 144. In some embodiments, air passes through drop ceiling 140 through ceiling openings 146. In one embodiment, one or more of openings is formed by leaving a ceiling tile out of an array of tiles that the forms the ceiling. In one embodiment, openings 146 are 2×2 foot square openings. In certain embodiments, openings 146 include vents that can be manually or automatically adjusted to vary airflow. In certain embodiments, openings 146 include flow restriction devices.

Stacks 150 are provided between the top of racks 104 and 106 and ceiling 142. Stacks 150 may be coupled to ceiling 142 at the top of stack 150 and coupled to rack 104 or 106 and the bottom of stack 150. Stacks 150 may at least partially segregate cooling air leaving rack exit ports 107 from room ambient air 154 in room 108. In some embodiments, stacks 150 are provided on all of racks in a computer room. In other embodiments, stacks may be provided on only one, or only some, of the racks in a computer room. In one embodiment, stacks 150 isolate all the cooling air exiting each rack from room ambient air 154, for all the racks in the data room.

Control unit 116 may be programmed to control devices in handling sub-systems 110 and/or chilled water sub-systems 120. Control unit 116 is configured to sense and measure a plurality of environmental parameters and modulate a differential temperature across each of racks 104 and 106. Control unit 450 is in data communication with temperature sensors 160, 162, and 164 and humidity sensors 164, 168, and 170. Devices in air handling sub-system 110 and chilled water sub-systems 120 may be controlled automatically, manually, or a combination thereof.

In certain embodiments, control unit 116 includes at least one programmable logic controller. The PLC may, among other things, open and close dampers in air handling system 110 based upon command signals from an operator to channel air flow through data center 102 as necessary for the prevailing operational conditions. Alternatively, the PLC may modulate dampers between fully open and fully closed positions to modulate airflow.

Cooling system 100 also includes a plurality of temperature measurement devices that, in one embodiment, are thermocouples. Alternatively, the temperature measurement devices include, but not limited to, resistance temperature detectors (RTDs) and any device that facilitate operation of cooling system 100 as described herein. For example, a chilled water thermocouple may be positioned within chilled water subsystem 120 to facilitate measuring a temperature of the chilled water upon discharge from a heat exchanger. In the one embodiment, such chilled water temperatures are controlled to approximately 5.6 degrees Celsius (° C.) (42 degrees Fahrenheit (° F.)).

Cooling system 100 includes temperature sensor 160 and humidity sensor 162 positioned within plenum 128. Temperature sensor 160 and humidity sensor 162 may be configured to facilitate measuring a temperature of air within plenum 128 prior to being channeled towards racks 104 and 106. In the one embodiment, a plurality of thermocouples are positioned approximately 3 meters (m) (10 feet (ft)) apart to facilitate measurement redundancy and measurement averaging across plenum 128. Alternatively, any number of thermocouples positioned anywhere within plenum 128 that facilitates operation of system 100 as described herein is used.

Cooling system 100 also includes temperature sensor 164 and humidity sensor 166 positioned within plenum 144. Temperature sensor 164 and humidity sensor 166 may be configured to facilitate measuring temperature and humidity of air within plenum 144 subsequent to being channeled from racks 104 and 106. In one embodiment, a plurality of thermocouples are positioned approximately 3 meters (m) (10 feet (ft)) apart to facilitate redundancy and measurement averaging in a manner similar to that used with thermocouples within plenum 128. Alternatively, any number of thermocouples positioned anywhere within plenum 144 that facilitates operation of cooling system 100 as described herein is used.

Cooling system 100 also includes temperature sensor 168 and humidity sensor 170 positioned outside data center 102. Temperature sensor 168 and humidity sensor 170 may be configured to facilitate measuring temperature and humidity of outside ambient air, for use in controlling operating characteristics of cooling system 100.

In some embodiments, data from one or more temperature, humidity, or pressure sensors is used to determine an air source. For example, an air handling sub-system 110 may include a system of dampers that allows cooling air to either be drawn from outside air and then exhausted, or recycled within the data center. A control unit may operate the dampers to either use outside air or recycled air, depending on, among other things, the entropy of the outside air.

In one embodiment, air is channeled from duct 174 into plenum 128 such that a predetermined substantially static pressure is maintained within plenum 128. A static pressure may be measured in plenum 128. Air is then channeled upward from plenum 128 through devices 130 and 132, wherein devices 130 and 132 facilitate channeling predetermined air flows that impinge on racks 104 and 106. In one embodiment, the temperature of air discharged from plenum 128 is approximately 10° C. (50° F.).

Air is subsequently channeled across and through racks 104 and 106 wherein the air absorbs at least some of the waste heat generated within racks 104 and 106. Warmed air is channeled upward from racks 104 and 106 through exit ports 107 and through stacks 150 and into plenum 144, where the warmed air may be partially mixed. Air is channeled from plenum 144. The warmed air is subsequently channeled into a duct for another transit through air handling subsystem 110, channeled to another air handling system, or rejected to outside ambient air.

For illustrative purposes, only one air handling sub-system is shown in FIG. 1. The number of air handling sub-systems in a cooling system may vary, however. In some embodiments, a cooling system includes many air handling sub-systems. In facilities with multiple air handling sub-systems and/or multiple data centers, cross-over ducts may be provided (e.g., on the supply side, the return side, or both) to allow cooling air from air handling sub-systems to be distributed and/or redirected within a data center or among data centers. Air handling sub-systems may be commonly controlled, separately controlled, or a combination thereof. In certain embodiments, some or all of the air handling sub-systems for a data center are provided with outside air vents.

FIGS. 2A, 2B, and 2C illustrate one embodiment of a stack having flexible portions on opposing sides of the stack. Stack 150 includes upper duct portion 180, flexible portion 182, and lower duct portion 184. The top of upper duct portion 180 includes exit opening 186. The bottom of lower duct portion 184 includes inlet opening 188.

Upper duct portion 180 includes tabs 190 and fasteners 192. Tabs 190 may accommodate fasteners 192. Fasteners 192 may be used to secure stack 150 to ceiling 144 (see, for example, drop ceiling 140 in FIG. 1). In one embodiment, fasteners 192 are captive fasteners.

Lower duct portion 184 may include magnets 194. Magnets 194 may be coupled to the top of a rack system (e.g., rack 104 shown in FIG. 1). Magnets may allow for adjustment in the position of inlet opening 188 relative to the rack system. For example, lower duct portion 184 may be aligned such that inlet opening 188 is aligned with an exit port of a rack system (e.g., exit port 107 shown in FIG. 1).

Flexible portion 182 may be made of a flexible material. In some embodiments, flexible portion 182 is made of an expandable fabric. In one embodiment, flexible portion 182 is made of a plastic (e.g., polymeric) sheet material. In one embodiment, a plastic sheet material has a thickness of about 4 mm. Other suitable materials may include metal or rubber. The flexible material may be a fire-retardant material. In one embodiment, flexible portion 182 may include a bellows-type construction (e.g., with corrugations that allow the material to be shortened or lengthened). Flexible portion 182 may be permanently attached to upper duct portion 180 and lower duct portion 184, or may be separable or removable from either or both of upper duct portion 180 and lower duct portion 184.

FIG. 3 illustrates a cross-sectional area of the stack shown in FIGS. 2A, 2B, and 2C. A cross-sectional area of a passageway may increase with the height of the passageway over at least a portion of the height of the passageway. For example, in the embodiment shown in FIG. 3, the width of passageway 198 increases from the lower edge of flexible portion 182 to the upper edge of flexible portion 182. In some embodiments, an opening at an inlet portion of a stack has a smaller cross sectional area than an opening of at exit portion of the stack. For example, an inlet opening may be about 6 inches by 12 inches, and an exit opening may be about 24 inches by 24 inches. In certain embodiments, a passageway in a stack may produce a chimney effect, thereby promoting a flow of exit cooling air from a rack system. For example, a stack may include a funnel-shaped passageway whose cross-sectional area increases with height. The funnel-shaped passageway may accelerate the flow of exit air in the passageway. In some embodiments, the passage of air from the stack into an overhead discharge plenum above the ceiling line (which has a larger cross sectional area than the exit opening of the stack) may further promote the flow of air from a rack system.

Although in the embodiment shown in FIGS. 2A, 2B, and 2C, stack 150 is described as coupled to ceiling with fasteners, and coupled to the rack with magnets, in other embodiments a stack may be coupled in a variety of other ways. For example, a lower portion of a stack may be pinned or bolted to the rack. As another example, an upper portion of a stack may be attached to a ceiling with clips or hangers.

In some embodiments, a lower portion of a stack is adjustable relative to the upper portion. FIG. 4 illustrates adjustment of a stack having flexible portions. Flexible portion 182 of stack 150 may allow lower duct portion 184 to be moved laterally relative to upper duct portion 180 (e.g., from initial position 199 to adjusted position 197).

Adjustment of lower duct portion 184 may allow inlet opening 188 to be aligned with an exit port of a rack system (e.g., racks 104 or 106) while upper duct portion 180 is attached to a ceiling. In certain embodiments, flexible portion 182 may allow for a height adjustment of stack (e.g., to accommodate differences in spacing between various racks and a ceiling.)

Figure 5A:
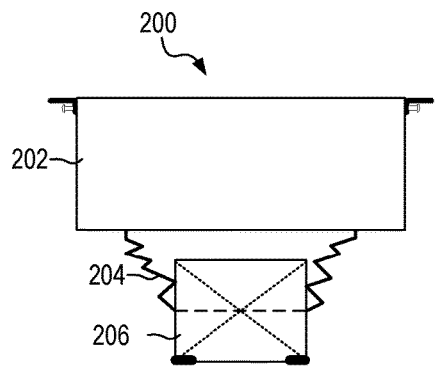
FIGS. 5A, 5B, and 5C illustrate one embodiment of a stack having a flexible portion along the entire perimeter of the stack.
Figure 5B:
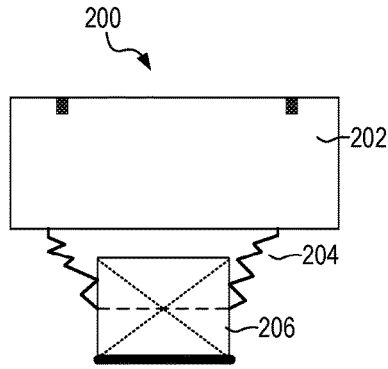
Figure 5C:
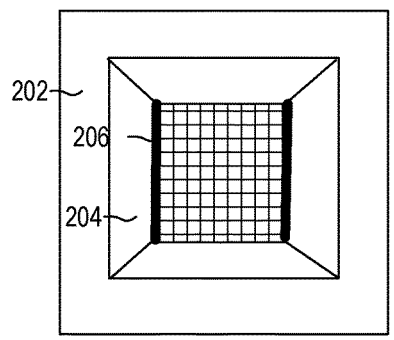

FIGS. 5A, 5B, and 5C illustrate one embodiment of a stack having a flexible portion along the entire perimeter of the stack. Stack 200 includes upper duct portion 202, flexible portion 204, and lower duct portion 206. Flexible portion 204 may extend around the entire perimeter of upper duct portion 202 and lower duct portion 206. Lower duct portion 206 may be laterally adjustable in all directions (e.g., within a horizontal plane) relative to upper duct portion 202.

Figure 6:
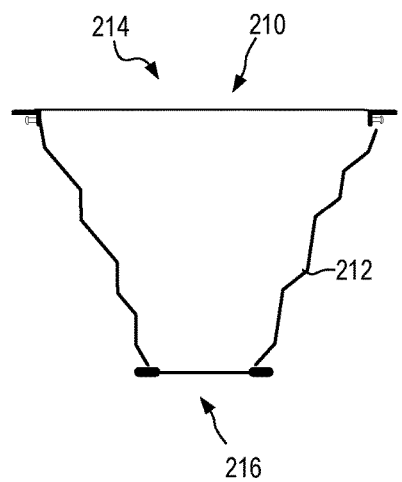
FIG. 6 illustrates an embodiment of a stack having a flexible portion that extends the full height of the stack.

FIG. 6 illustrates an embodiment of a stack having a flexible portion that extends the full height of the stack. Stack 210 includes flexible portion 212, exit opening 214, and inlet opening 216. In certain embodiments, the size and/or shape of inlet opening 216 may be adjusted by manipulating flexible portion 212 proximate to the inlet opening.

Although in the embodiment shown relative to FIGS. 2A, 2B, and 2C and 4A, 4B, and 4C, stack 150 is shown as a combination of duct sections and an intermediate flexible portion, a stack may in other embodiments be of different constructions. For example, a stack may be in form of a curtain or a set of curtains. The curtain or curtain may be arranged to form a passageway (sealed or unsealed) to direct exit air from a rack to the ceiling of a computer room. In another embodiment, a stack is a funnel-shaped tube. The tube may be formed from plastic sheet, fabric, or other suitable material. Magnets may be used to couple the inlet portion of the stack exit ports. In certain embodiments, a stack may be coupled to exit ports on a front, back, or side of a rack. The flexible portion (e.g., fabric curtain) may be manipulated to allow magnets on the stack to couple with the rack such that air from the exit ports is directed into a passageway of the stack.

Figure 7:
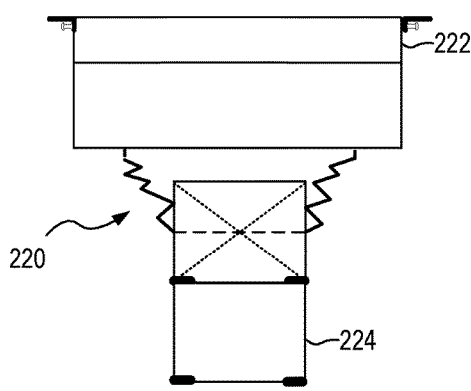
FIG. 7 illustrates one embodiment of a stack including extension ducts.

In certain embodiments, a stack includes a combination of members selected to bridge a gap elements of a cooling system. FIG. 7 illustrates an embodiment of a stack including extension ducts. In this example, stack 220 includes a stack similar to stack 150 shown in FIGS. 2A, 2B, and 2C. Stack 220 further includes upper extension duct 222 and lower extension duct 224. The heights of upper extension duct 222 and/or lower extension duct 224 may be selected to achieve an appropriate overall height of stack 220.

Figure 8:
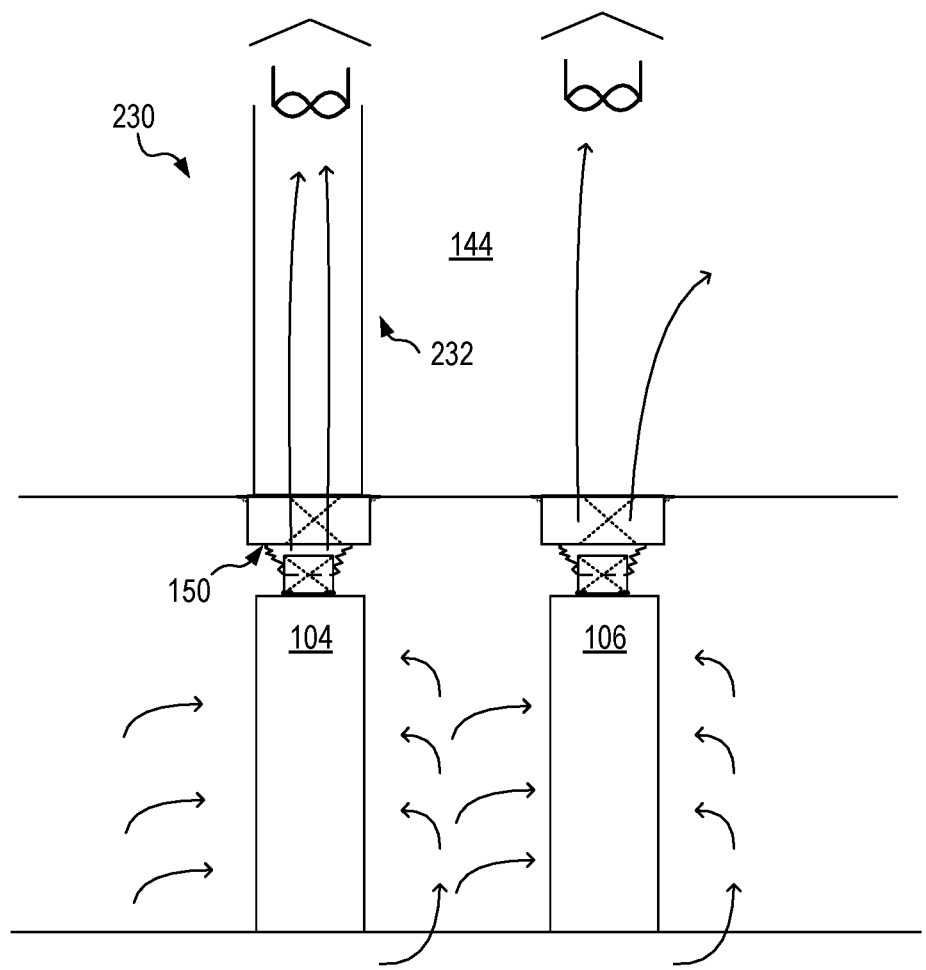
FIG. 8 illustrates an alternate embodiment of a cooling system.

FIG. 8 illustrates an alternate embodiment of a cooling system. Cooling system 230 may be similar to cooling system 100 shown in FIG. 1, except that exit air from rack 104 is directed into exit duct 232. Exit duct 232 may segregate the exit air of rack 104 from the exit air of rack 106 and other racks in the room. In one embodiment, cooler air in overhead plenum 144 may be recirculated to room 108, while warmer air in duct 232 may be purged into the ambient outside air. In certain embodiments, exit air from two or more racks may be merged in a single duct. The merged air may be segregated from air an overhead air discharge plenum. In certain embodiments, air from all the racks in a room may be collected into one or more ducts.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:
1. A method of cooling rack mounted computers in a computer room, comprising:
moving air through one or more computers in a rack system;
directing, via a stack, the air away from the rack system to an opening in a ceiling of the computer room such that the air exiting the rack system is at least partially segregated from ambient air in the computer room by the stack;

directing, via an exit duct coupled with an exit of the stack, the air away from the opening in the ceiling of the computer room into a ceiling plenum above the opening in the ceiling; and segregating air exiting the rack system and passing through the exit duct from air circulating within the ceiling plenum and air entering the ceiling plenum from one or more other rack systems, such that air circulating within the ceiling plenum and air entering the ceiling plenum from one or more other rack systems is recirculated to the computer room and such that the air passing through the exit duct passes into ambient air outside the ceiling plenum.

2. The method of claim 1, wherein the stack is coupled between the rack system and the ceiling of the computer room.

3. The method of claim 2, wherein directing the air via the stack coupled between the rack system and the ceiling comprises directing the air via a flexible portion of the stack that aligns an inlet portion of the stack with an exit portion of the rack system while an exit portion of the stack is coupled to the ceiling.

4. The method of claim 2, wherein directing the air via the stack coupled between the rack system and the ceiling comprises directing the air via a flexible portion of the stack that aligns an exit portion of the stack with the ceiling of the computer room while an inlet portion of the stack is coupled to the rack system.

5. The method of claim 2, wherein directing the air via the stack between the rack system and a ceiling of the computer room comprises directing the air via a flexible portion of the stack that is adjustable to alter a size of an opening in an inlet portion of the stack.

6. The method of claim 2, further comprising segregating, via the stack, the exiting air from ambient air in the computer room.

7. The method of claim 2, further comprising producing, via the stack, a chimney effect that promotes a flow of exit air from the rack system.

8. The method of claim 1, further comprising measuring at least one characteristic of air above the ceiling, and adjusting at least one characteristic of an air handling system for the computer room based on the at least one measured characteristic.

9. The method of claim 8, wherein the adjusted characteristic comprises a source of air.

10. The method of claim 8, wherein the adjusted characteristic comprises a flow rate of air.

11. The method of claim 1, further comprising forcing, via a forced air system, air into a room comprising the rack system.

12. The method of claim 11, wherein forcing air into the room comprises channeling air into a floor plenum such that a predetermined substantially static pressure is maintained within the floor plenum.

13. The method of claim 1, further comprising measuring, by one or more sensors, air temperature in the floor plenum prior to being channeled to the rack system.

14. The method of claim 13, further comprising:
receiving one or more measurements of air temperature in the floor plenum; and
modulating, based at least in part on the one or more measurements of air temperature in the floor plenum, one or more variable frequency drivers to maintain a predetermined differential temperature across the rack system.

15. The method of claim 1, further comprising measuring at least one characteristic of outside ambient air, and adjusting at least one characteristic of an air handling system for the computer room based on the at least one measured characteristic.

16. The method of claim 1, further comprising measuring at least one characteristic of air before it enters the computer room, and adjusting at least one characteristic of an air handling system for the computer room based on the at least one measured characteristic.

17. The method of claim 1, further comprising recirculating air from the ceiling plenum to the air being moved through the one or more computers in the rack system.

18. The method of claim 17, further comprising purging air from the exit duct into ambient outside air.

19. The method of claim 1, further comprising merging air from two or more racks into a single exit duct.

20. The method of claim 1, wherein said directing the air away from the rack system to the opening in the ceiling of the computer room comprises directing the air via a stack between the rack system and a ceiling of the computer room, wherein the stack comprises a magnet portion.

* * * * *